United States Patent
Lim et al.

(10) Patent No.: US 8,199,456 B2
(45) Date of Patent: Jun. 12, 2012

(54) CAPACITOR AND MANUFACTURING METHOD THEREOF

(75) Inventors: Sung-Taek Lim, Suwon-si (KR);
Yul-Kyo Chung, Yongin-si (KR);
Woon-Chun Kim, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 823 days.

(21) Appl. No.: 12/078,648

(22) Filed: Apr. 2, 2008

(65) Prior Publication Data
US 2008/0259523 A1    Oct. 23, 2008

(30) Foreign Application Priority Data

Apr. 18, 2007 (KR) .................. 10-2007-0037740

(51) Int. Cl.
*H01G 4/06* (2006.01)
(52) U.S. Cl. ........ 361/311; 361/309; 361/312; 361/313; 361/306.1; 361/301.4
(58) Field of Classification Search .................. 361/311, 361/312–313, 301.2, 301.4, 306.1, 306.3, 361/321.2
See application file for complete search history.

(56) References Cited

U.S. PATENT DOCUMENTS

| | | | |
|---|---|---|---|
| 5,219,611 A | | 6/1993 | Giannelis et al. |
| 5,640,049 A | * | 6/1997 | Rostoker et al. ............ 257/758 |
| 5,920,454 A | * | 7/1999 | Nomura et al. ............ 361/313 |
| 5,973,908 A | * | 10/1999 | Saia et al. .................. 361/311 |
| 6,838,160 B2 | * | 1/2005 | Sasaki et al. .............. 428/220 |
| 7,186,919 B2 | * | 3/2007 | Kim et al. .................. 174/250 |
| 7,192,654 B2 | * | 3/2007 | Andresakis et al. ........ 428/626 |
| 7,279,777 B2 | * | 10/2007 | Bai et al. .................... 257/642 |
| 7,615,130 B2 | * | 11/2009 | Shelnut et al. ............. 156/247 |
| 2006/0032666 A1 | | 2/2006 | Kim et al. | |

FOREIGN PATENT DOCUMENTS

| | | |
|---|---|---|
| DE | 1 546 001 | 3/1970 |
| JP | 60-170229 | 9/1985 |
| JP | 1-108161 | 4/1989 |
| JP | 2-203511 | 8/1990 |
| JP | 2-279520 | 11/1990 |
| JP | 7-37754 | 2/1995 |
| JP | 2000-31387 | 1/2000 |
| JP | 2003-158378 | 5/2003 |
| JP | 2005-93736 | 4/2005 |

OTHER PUBLICATIONS extended European search report dated Aug. 21, 2008, corresponding to European Application No. 08 251 275.7.
Japanese Office Action issued Sep. 7, 2010 in corresponding Japanese Patent Application 2008-106013.

* cited by examiner

*Primary Examiner* — Nguyen T Ha

(57) ABSTRACT

A capacitor and a method of manufacturing the capacitor are disclosed. The capacitor may include a board, a polymer layer formed on one side of the board, a circuit pattern selectively formed over the polymer layer, and a titania nanosheet corresponding with the circuit pattern. Embodiments of the invention can provide flatness in the board, and allows the copper of the board to maintain its functionality as an electrode while increasing the adhesion to the titania nanosheet. The titania nanosheet may thus be implemented on a patterned board in a desired shape, number of layers, and thickness.

19 Claims, 13 Drawing Sheets

CAPACITOR AND MANUFACTURING METHOD THEREOF

CROSS-REFERENCE TO RELATED APPLICATIONS

This application claims the benefit of Korean Patent Application No. 10-2007-0037740 filed with the Korean Intellectual Property Office on Apr. 18, 2007, the disclosure of which is incorporated herein by reference in its entirety.

BACKGROUND

1. Technical Field

The present invention relates to a capacitor and a method of manufacturing the capacitor.

2. Description of the Related Art

With recent technological advances in the electronics industry, various fields of technology are actively being integrated, in efforts to satisfy user demands for lighter, thinner, and more compact products and for ubiquitous services.

Independent or integrated developments in electric, electronic, and communication technologies, as well as in electronic materials and components, may be seen in various fields, based on research efforts for individual development or commercialization.

Among such various technologies, the digital IC (integrated circuit) chip is being given higher operation frequencies and lower operation voltages, as a method of implementing state-of-the-art functionalities in the lighter, thinner, and more compact products and utilizing state-of-the-art materials in electronic components.

Also, the low-impedance decoupling capacitor, for removing switching noise, is becoming increasingly important.

The closer a decoupling capacitor is to an IC chip, the more it is able to lower impedance. As such, there have been many reports on techniques of forming the capacitors over the IC.

In the case of using an off-chip capacitor, the capacitor may be attached to the PCB or the IC package. Here, parasitic inductance may occur, due to the length of wire extending from the chip to the capacitor, which may cause problems in high-frequency characteristics.

Forming a capacitor during the process for forming a transistor on silicon may also cause the following problems.

First, the material used for electrodes within the chip may have a high resistance value, making it difficult to produce a capacitor that has a Q value of 10 or higher. Secondly, making passive components inside the chip entails a complicated fabricating process which increases process costs, and thus increases the cost per unit area.

Therefore, in step with the developments of various circuit design techniques, there has appeared a demand for material processing techniques that enhance the function of decoupling and increase production efficiency.

Recently, new materials having high dielectric constants have been presented, as well as various methods for forming them at low temperatures. When applying these materials to PCB processes, the materials may be such that can be wired and designed as desired, in relation to other components and the circuits on the board.

However, in many cases, the material being presented is focused only on the role as a basic capacitor, formed by attaching electrodes on either side, with problems remaining with regard to the structures and methods for implementing the material to a PCB made of a dielectric material.

First, because of the low flatness of the copper clad laminate used as the material for the core in a printed circuit board, problems may occur in stacking a dielectric material on the surface.

Also, because there is low adhesion between the copper (Cu) of the copper clad laminate and dielectric materials, expensive thin film deposition processes may be required, which use platinum (Pt), gold (Au), etc.

Also, in certain cases, the dielectric material may be such that cannot be patterned to a desired form, so that it may be impossible to implement as an electronic material.

SUMMARY

An aspect of the invention provides a capacitor, and a method of manufacturing the capacitor, in which the flatness of the copper clad laminate is increased in the printed circuit board, the adhesion between copper and the dielectric material is increased, and the dielectric material can be patterned to a desired form.

Another aspect of the invention provides a capacitor that includes a board, a polymer layer formed on one side of the board, a circuit pattern selectively formed over the polymer layer, and a titania nanosheet corresponding with the circuit pattern.

The board may be a copper clad laminate. The capacitor may further include an adhesive layer, which may be interposed between one side of the board and the polymer layer, to attach the polymer layer to the one side of the board.

The capacitor may include a seed layer interposed between the polymer layer and the circuit pattern, where the seed layer may be formed by a sputtering method.

The capacitor may include a titanium (Ti) layer, corresponding with the circuit pattern, which may be interposed between the circuit pattern and the titania nanosheet, to attach the titania nanosheet to the circuit pattern. The titanium layer can be formed by a sputtering method, and can be formed to a thickness of 200 to 300 nm.

Yet another aspect of the invention provides a method of manufacturing a capacitor, which includes forming a polymer layer over a board, forming a plating layer over the polymer layer, forming a circuit pattern by selectively removing the plating layer, and stacking a titania nanosheet over the circuit pattern that corresponds with the circuit pattern.

Here, the board may be a copper clad laminate.

Forming the polymer layer may include attaching the polymer layer to the board by interposing an adhesive layer between the board and the polymer layer. In certain embodiments, the method may further include applying plasma treatment on a surface of the polymer layer for pretreatment, after the forming of the polymer layer.

The method may further include, after applying the plasma treatment, stacking a seed layer over the polymer layer, which can be performed by a sputtering method.

The operation of forming the circuit pattern can include: stacking a first plating resist over the plating layer and selectively removing the first plating resist, etching the exposed plating layer, and stripping the first plating resist remaining after the removal.

The operation of stacking the titania nanosheet may include: stacking a second plating resist over portions excluding the circuit pattern, coating a titanium layer over the circuit pattern and the second plating resist, removing the second plating resist coated with the titanium layer such that the circuit pattern is formed with the titanium layer coated on a surface, and attaching the titania nanosheet to the circuit pattern coated with the titanium layer such that the titania nanosheet is in correspondence with the circuit pattern.

Here, the coating of the titanium layer can be performed by a sputtering method.

Additional aspects and advantages of the present invention will be set forth in part in the description which follows, and in part will be obvious from the description, or may be learned by practice of the invention.

BRIEF DESCRIPTION OF THE DRAWINGS

FIG. 3A, FIG. 3B, FIG. 3C, FIG. 3D, FIG. 3E, FIG. 3F, FIG. 3G, FIG. 3H, FIG. 3I, FIG. 3J, and FIG. 3K are cross-sectional views representing a flow diagram for a method of manufacturing a capacitor according to an embodiment of the invention.

DETAILED DESCRIPTION

Figure 1:
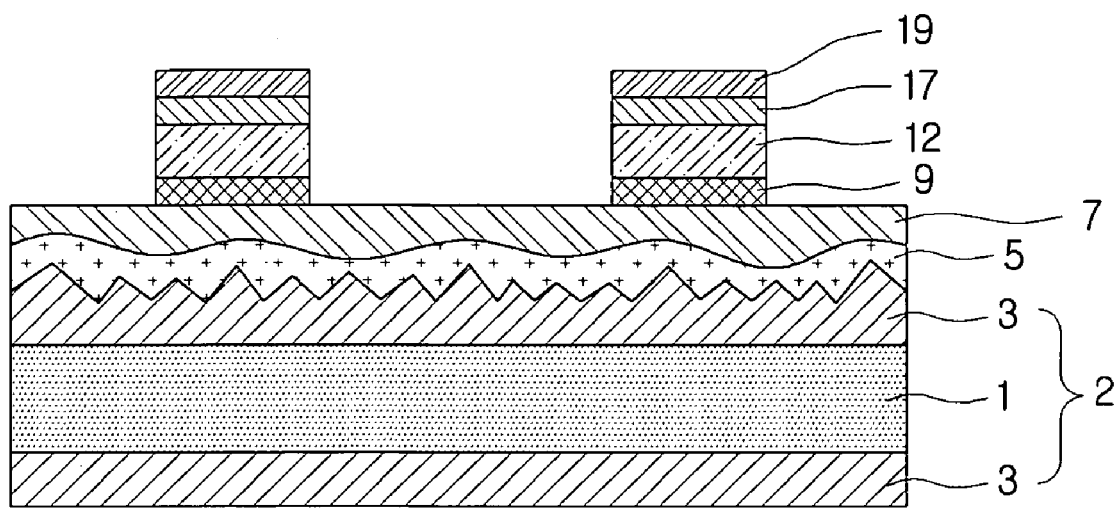
FIG. 1 is a cross-sectional view of a capacitor according to an embodiment of the invention.

The capacitor and method of manufacturing the capacitor according to certain embodiments of the invention will be described below in more detail with reference to the accompanying drawings. Those elements that are the same or are in correspondence are rendered the same reference numeral regardless of the figure number, and redundant explanations are omitted.

FIG. 1 is a cross-sectional view of a capacitor according to an embodiment of the invention. In FIG. 1, there are illustrated an epoxy layer 1, a board 2, copper layers 3, an adhesive layer 5, a polymer layer 7, a seed layer 9, a circuit pattern 12, a titanium layer 17, and a titania nanosheet 19.

A board 2 in this particular embodiment may be a copper clad laminate (CCL), in which copper layers 3 are stacked onto both sides of an epoxy layer 1. In a copper clad laminate, the copper layers 3 can be made, according to the fabrication process for copper foils, to have a rough surface on one side and a smooth surface on the other side. In this particular embodiment, one side of the copper clad laminate will be defined as the rough side.

Because the surface of the copper clad laminate that is exposed may be the rough surface, when stacking a nanometer-scale titania nanosheet 19 onto the copper clad laminate, the rough protrusions may not allow complete stacking over the surface.

Thus, to resolve this, a polymer layer 7 may be interposed between one side of the board 2, i.e. the rough surface of the board 2, and the titania nanosheet 19 to maintain the flatness of the board. A polymer material that suits the purpose of providing flatness in the board 2 may be stacked on in the form of a film, to form the polymer layer 7 and lessen the degree of roughness on the surface of the copper clad laminate.

An adhesive layer 5 may additionally be included between the surface of the board 2 and the polymer layer 7, to attach the polymer layer 7 to the surface of the board 2. A polymer adhesive sheet in the form of a very thin film, which does not significantly increase thickness, can be used for the adhesive layer 5.

The polymer layer 7, for use as a board material, may be treated at a sufficiently high temperature and kept stable before the stacking, to obtain satisfactory properties in terms of thermal expansion.

After flattening the board 2 by forming the polymer layer 7 on the surface of the copper clad laminate with an adhesive layer 5 interposed, a plasma treatment may be applied as pretreatment to the surface of the polymer layer 7. By applying the plasma treatment, a seed layer 9 for performing plating, which will be described later in further detail, may be attached onto the polymer layer 7 in a stable manner.

If a plasma treatment is not applied, it may be difficult to implement high adhesion between the seed layer 9 and the polymer layer 7, which can cause problems in reliability.

A seed layer 9 may be interposed between the polymer layer 7 and the circuit pattern 12. The seed layer 9 may be formed using a sputtering method, but the invention is not thus limited, and it is to be appreciated that other methods may be employed which allows a person skilled in the art to readily form the seed layer 9.

The circuit pattern 12 can be formed by performing electroplating over the seed layer 9 to grow a plating layer, and then selectively remove the plating layer, as illustrated in the drawing. By stacking a titania nanosheet 19, which will be described later in further detail, over the circuit pattern 12, the problem caused by surface roughness of not being able to effectively stack the nanosheet 19 can be overcome, compared to the case of stacking the titania nanosheet 19 directly on the surface of the board 2.

A titanium layer 17 that corresponds with the circuit pattern 12 may be interposed between the circuit pattern 12 and the titania nanosheet 19 described later, to attach the titania nanosheet 19 to the circuit pattern 12.

The titania nanosheet 19 is made of $TiO_2$, and is thus difficult to attach to the copper (Cu) surface of the copper clad laminate, i.e. the board material. As such, a thin film of the titanium layer 17 may be interposed, to allow the copper surface to maintain the basic functionality of an electrode, while at the same time providing adhesion.

Here, the titanium layer 17 may be formed using a sputtering method, before the effect of the plasma pretreatment performed on the polymer layer 7 is lost.

The titanium layer 17 can have a thickness of about 200 to 300 nm. When the titania nanosheet 19 is formed on the titanium layer 17, the stacking may be facilitated and a level of adhesion may be obtained, due to the very high affinity between the constituent elements.

The titania nanosheet 19 may be stacked over the titanium layer 17, which may be stacked in correspondence with the circuit pattern 12, so that consequently, the titania nanosheet 19 may be stacked in correspondence with the circuit pattern 12.

It is apparent that the titania nanosheet 19 corresponding with the circuit pattern 12 can be stacked directly, or can be implemented by stacking the titania nanosheet 19 over a plating layer coated with a plating layer and then selectively removing the titania nanosheet 19 to expose the polymer layer 7.

The titania nanosheet 19 can be formed by adsorbing lamina particles of titania onto the board as a layer, to implement an ultrathin film of titania nanosheet 19.

As such, it is possible to pattern the titania nanosheet 19 to a desired shape, and to adjust the number of layers and thickness according to the stacking process. Since the titania nanosheet 19, which has a high dielectric constant, can be formed to a desired shape in a desired area, it can be applied to various electrical materials that require materials having high dielectric constants.

In particular, a dielectric can be fabricated not only on high-precision semiconductor materials such as a silicon wafer, but also on a PCB board using typical electrode materials such as copper.

To be more specific, the problem of limited area for passive components surface-mounted on a PCB of a multilayer structure, can be effectively resolved by employing the method of embedding the passive components in the inner layers of the board. Here, in order to provide the electrical properties that cannot be provided from the simple embedding by conventional materials, a highly dielectric material in the form of a thin film may be necessary.

The stacking of the nanosheet having a high dielectric constant can be easily implemented at low temperatures, without the use of expensive thin film deposition equipment employed in the sputtering, atomic layer deposition, or pulse laser deposition methods, etc., used for conventional amorphous dielectrics. Also, the nanosheet having a high dielectric constant can be used to readily form multiple plate-structure dielectric layers to the desired shapes, which may be used effectively in manufacturing component-embedded PCB'S.

Figure 2:
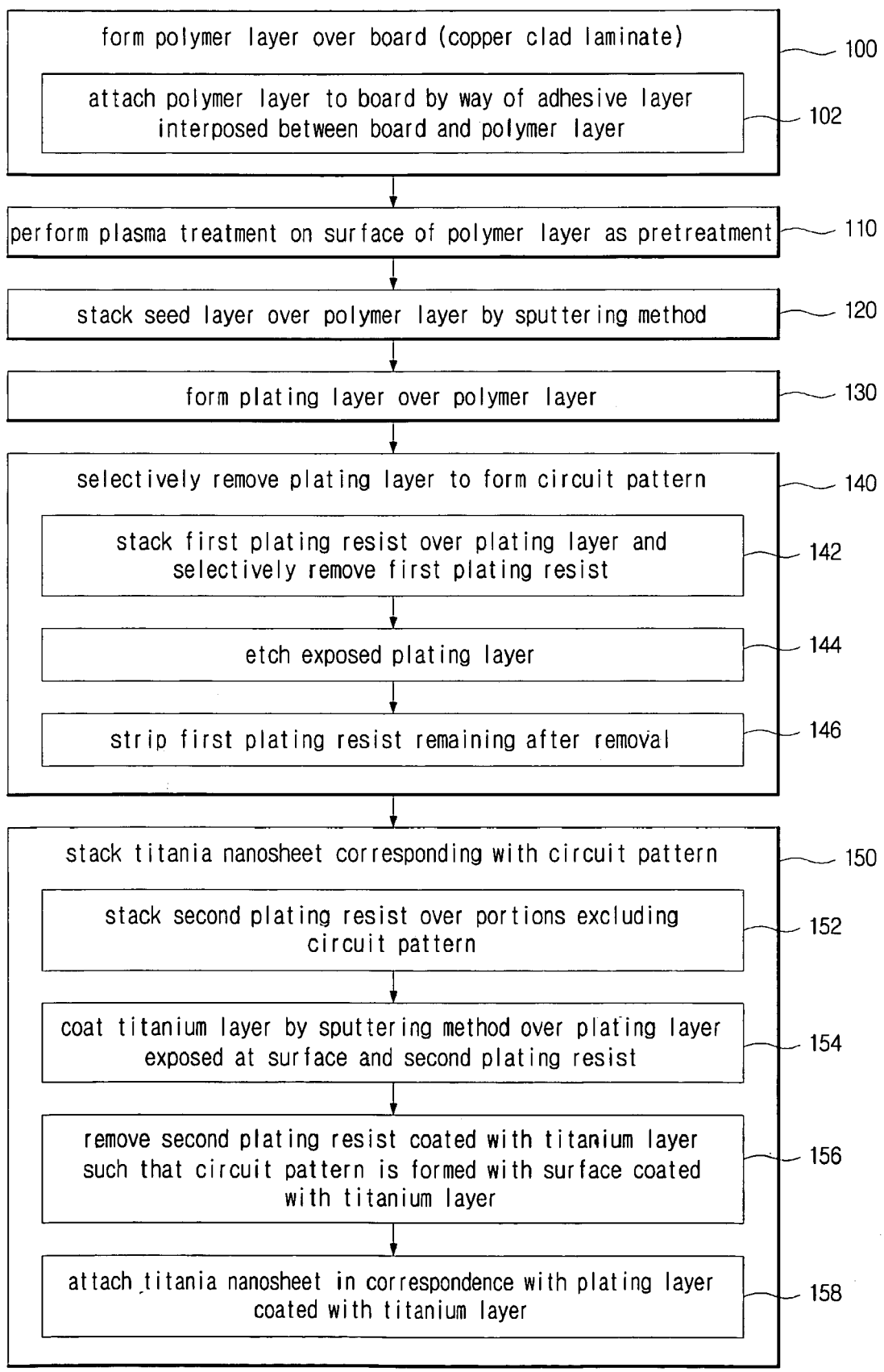
FIG. 2 is a flowchart for a method of manufacturing a capacitor according to an embodiment of the invention.

FIG. 2 is a flowchart for a method of manufacturing a capacitor according to an embodiment of the invention, while FIG. 3A through FIG. 3K are cross-sectional views representing a flow diagram for a method of manufacturing a capacitor according to an embodiment of the invention. In FIGS. 3A to 3K, there are illustrated an epoxy layer 1, a board 2, copper layers 3, an adhesive layer. 5, a polymer layer 7, a seed layer 9, a plating layer 11, a circuit pattern 12, a first plating resist 13, a second plating resist 15, a titanium layer 17, and a titania nanosheet 19.

An aspect of this invention provides a method of manufacturing a capacitor, which uses a method of embedding passive components inside the printed circuit board, uses a thin film titania nanosheet having a high dielectric constant to implement patterning for a desired number of layers, and provides flatness for a copper clad laminate while increasing adhesion.

Figure 3A:
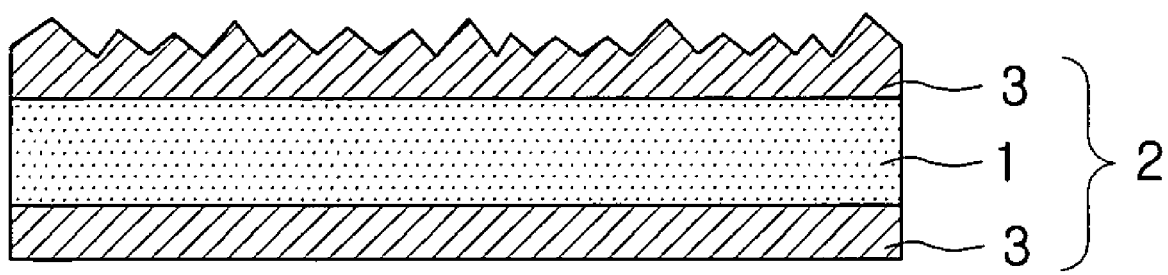

To manufacture a capacitor according to this embodiment, first, a board 2 may be prepared, as illustrated in FIG. 3A, which can be made with copper layers 3 stacked on both sides of an epoxy layer 1. While the board 2 in this particular embodiment is a copper clad laminate consisting of the epoxy layer 1 and copper layers 3, the board 2 is not limited to this configuration.

As illustrated in the drawings, the copper layer 3 on one side may be formed as a rough surface, while the copper layer 3 on the other side may be formed as a smooth surface, due to the process for manufacturing the board 2. The subsequent processes may be performed with the rough surface of the copper clad laminate exposed. Thus, when a titania nanosheet 19, described later, is stacked directly onto the rough surface of the board 2, the nanometer-level nanosheet may not be perfectly stacked over the surface of the board.

Figure 3B:
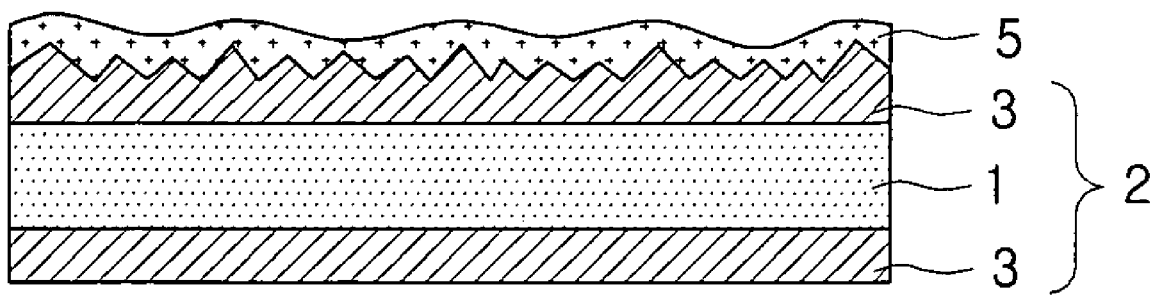

To resolve this, a polymer layer 7 may be formed on one side of the board 2 (100). First, as illustrated in FIG. 3B, an adhesive layer 5 can be formed on the board 2. That is, the polymer layer 7 may be attached to the board 2 with the adhesive layer 5 interposed between the board 2 and the polymer layer 7 (102).

Here, a polymer adhesive sheet in the form of a very thin film, which does not significantly increase thickness, can be used for the adhesive layer 5.

Figure 3C:
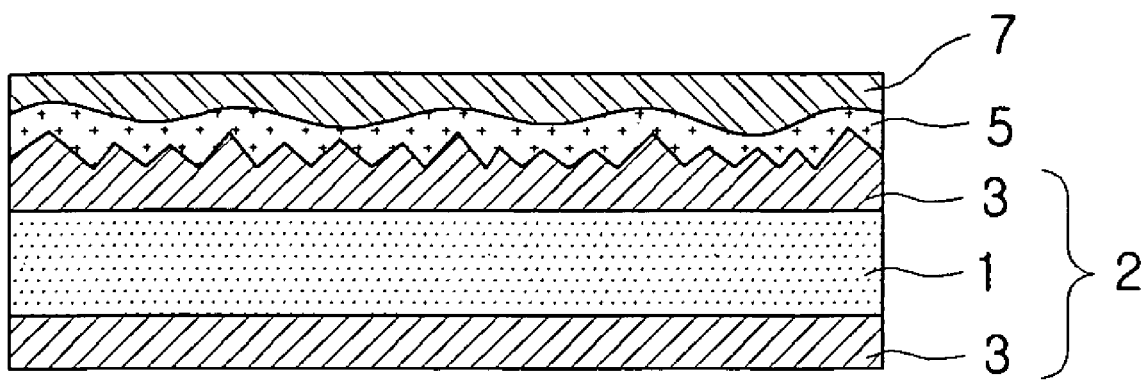

Next, as illustrated in FIG. 3C, the polymer layer 7 may be formed on the adhesive layer 5. By forming the polymer layer 7, the roughness of the board 2 can be lessened, and the board 2 can be made flatter.

The polymer layer 7 may be formed from polymers of imides or epoxy, and may be stacked in the form of a film, so as not to cause a significant increase in thickness in the surface of the copper.

Next, a plasma treatment may be performed, as a pretreatment, on the surface of the polymer layer 7 (110). By applying the plasma treatment, a metal seed layer 9 for performing plating may safely be attached to the polymer layer 7. This can provide adhesion between the polymer layer 7 and the seed layer 9 and can thereby increase reliability.

The technique of flattening the board 2 using a polymer layer 7 can provide a more level foundation, compared to CMP (chemical-mechanical polishing), which is used mainly in conventional semiconductor processes, or to EP (electropolishing), which utilizes the principles of plating processes.

In addition, the use of such dry attachment process can minimize the discharge of contaminants, which inevitably accompanies wet processes such as EP or CMP. Also, by using the dry attachment of an inexpensive polymer material, it is possible to fabricate the polymer layer 7 for an inexpensive nanoscale thin film stack.

Lastly, the polymer layer 7 fabricated according to this embodiment can be used for the stacking of nanosheets onto typical PCB materials, which was previously possible only with expensive polymer layers such as conventional wafers.

Figure 3D:
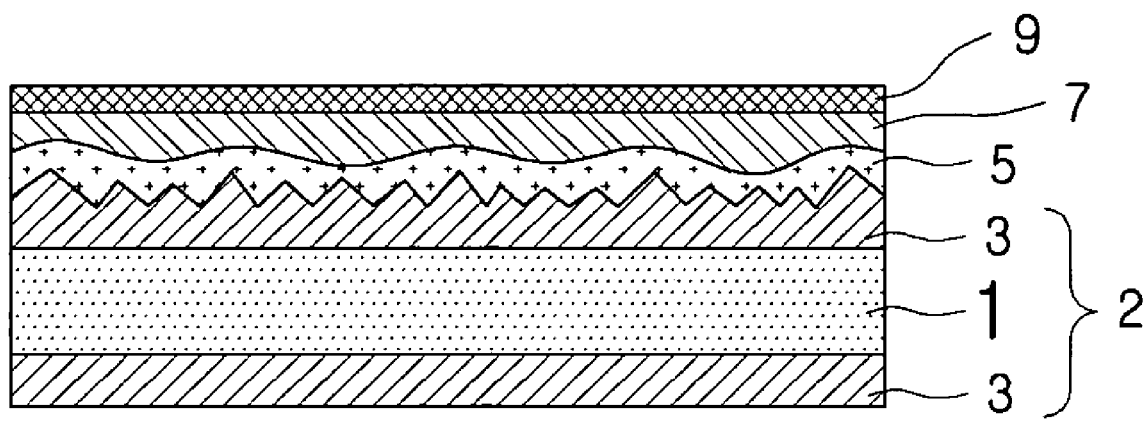

Next, a seed layer 9 may be stacked over the polymer layer 7, using a sputtering method (120). As illustrated in FIG. 3D, a seed layer 9 may be stacked over the polymer layer 7, in order to form a plating layer 11 which will serve as an electrode.

Figure 3E:
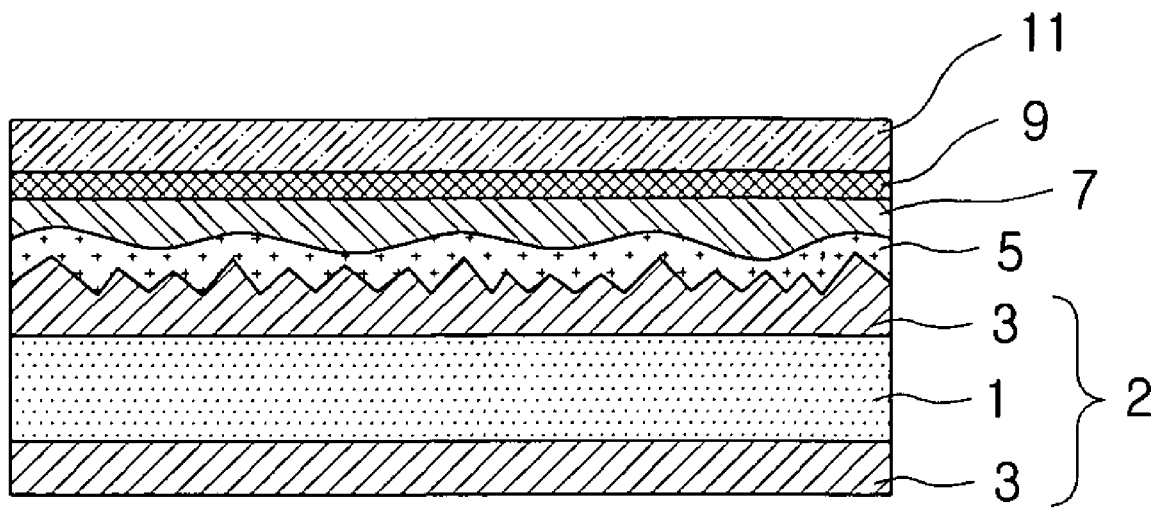

Electroplating may be performed over the stacked seed layer 9, to grow the plating layer 11 (130). By forming the plating layer 11, as illustrated in FIG. 3E, where the plating layer 11 can be a copper layer, a more elaborate surface flatness may be obtained compared to the copper layer 3 on the one side of the board 2, so that the titania nanosheet 19 described later may be stacked effectively.

Figure 3F:
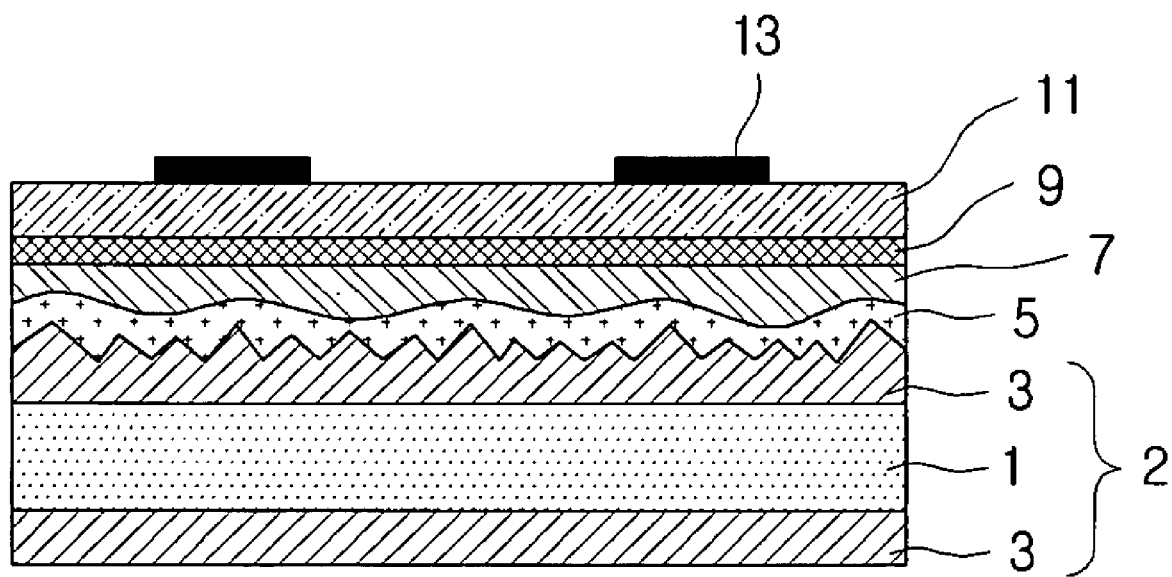

The formed plating layer 11 may be selectively removed to form a circuit pattern 12 (140). First, as illustrated in FIG. 3F, a first plating resist 13 may be stacked over the plating layer 11 and selectively removed in correspondence to the circuit pattern 12 (142). Here, the first plating resist 13 can be a dry film.

More specifically, after coating the first plating resist 13, a desired pattern may be formed by UV exposure, using a mask film that includes the desired pattern. The portions other than the area for forming the pattern may be removed by a development process.

The remaining film that is not removed can be the target area on which to place the titania nanosheet 19.

Figure 3G:
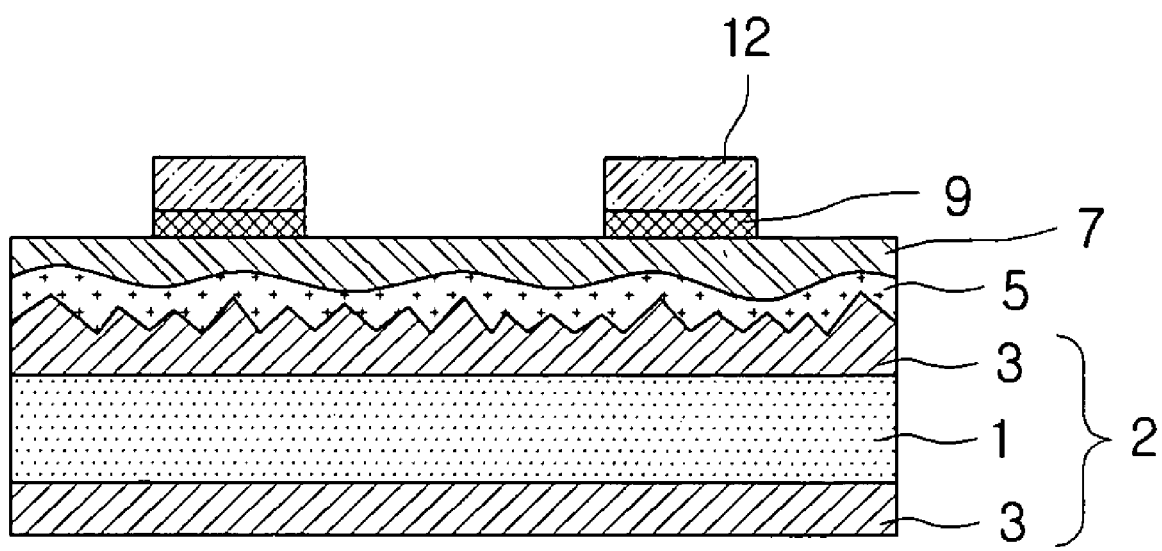

Next, as illustrated in FIG. 3C; the exposed plating layer 11 unprotected by the selectively removed first plating resist 13 may be etched (144), and the first plating resist 13 may be stripped (146). In this way, the circuit pattern 12, to which the titania nanosheet 19 will be stacked, may be implemented, as is illustrated in FIG. 3G.

Figure 3H:
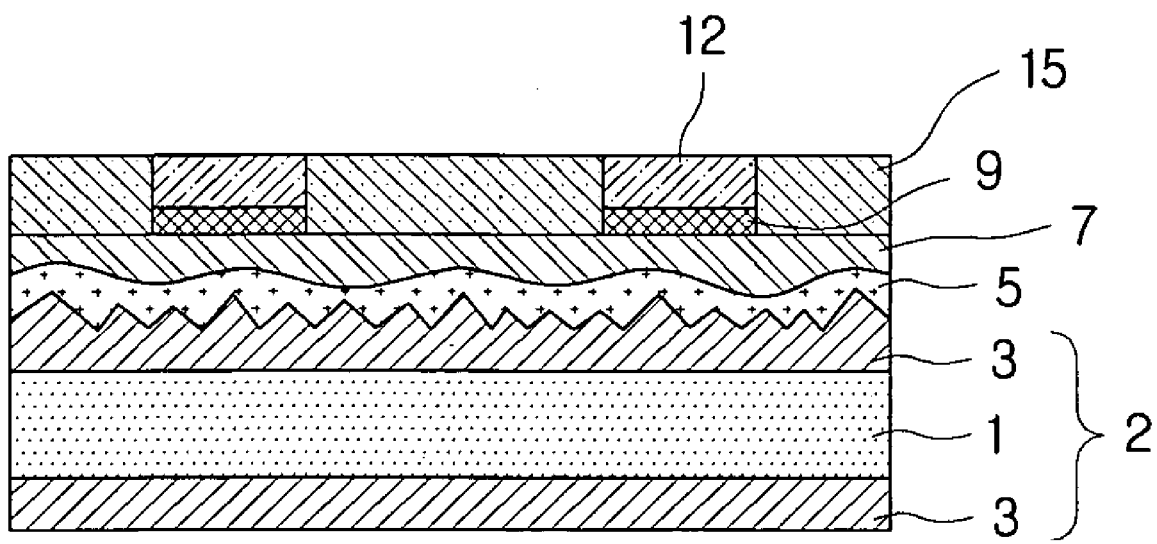
Figure 31:
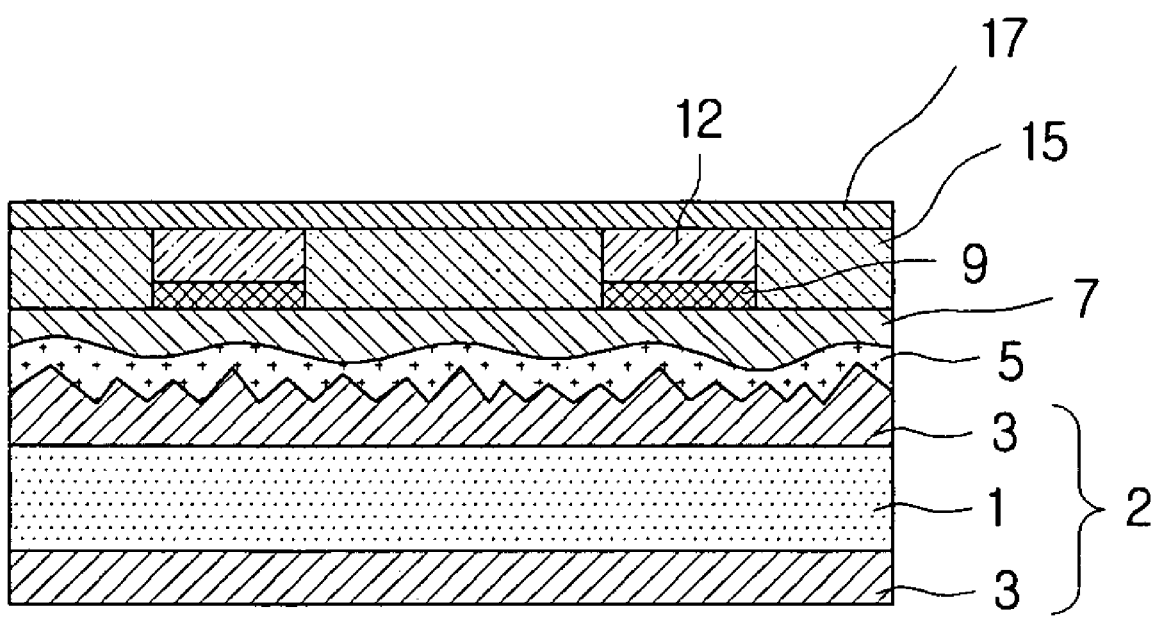

Next, the titania nanosheet 19 may be stacked, which is in a corresponding relationship with the circuit pattern 12 (150). As illustrated in FIG. 3H, the second plating resist 15 may be stacked on portions outside the circuit pattern 12 (152). It is apparent that the second plating resist 15 can be of the same material as that of the first plating resist 13 described above.

A thin film titanium layer 17 may be coated over the circuit pattern 12 and the second plating resist 15 using a sputtering method (154). The titanium layer 17 may be formed as illustrated in FIG. 3I, where, after the operation for forming the polymer layer 7 described above, the titanium layer 17 may be formed by a sputtering method while the effect of the plasma treatment for increasing adhesion to the seed layer 9 is maintained.

To be more specific, a reversed image of the copper etching pattern can be formed in a photomask. Then, the areas excluding those where the titania nanosheet 19 will be stacked may be covered, by attaching a dry film, attaching the mask, and performing exposure and development. Afterwards, the titanium layer 17 may be formed over the entire surface of the board, in order to provide adhesion between the titania nanosheet 19 and the copper of the circuit pattern 12.

The titania nanosheet 19 is made of $TiO_2$, and is thus difficult to attach to the copper surface. As such, a thin film of the titanium layer 17 may be interposed, which allows the copper surface to maintain the basic functionality of an electrode, while at the same time increasing the affinity to the constituent elements of the titania nanosheet 19 to increase adhesion.

The titanium layer 17 can have a thickness of about 200 to 300 nm. If the thickness is less than 200 nm, it may be difficult to maintain sufficient adhesion between the circuit pattern 12 and the titania nanosheet 19, whereas if the thickness is greater than 300 nm, it may be difficult to implement as a thin film dielectric.

Figure 3J:
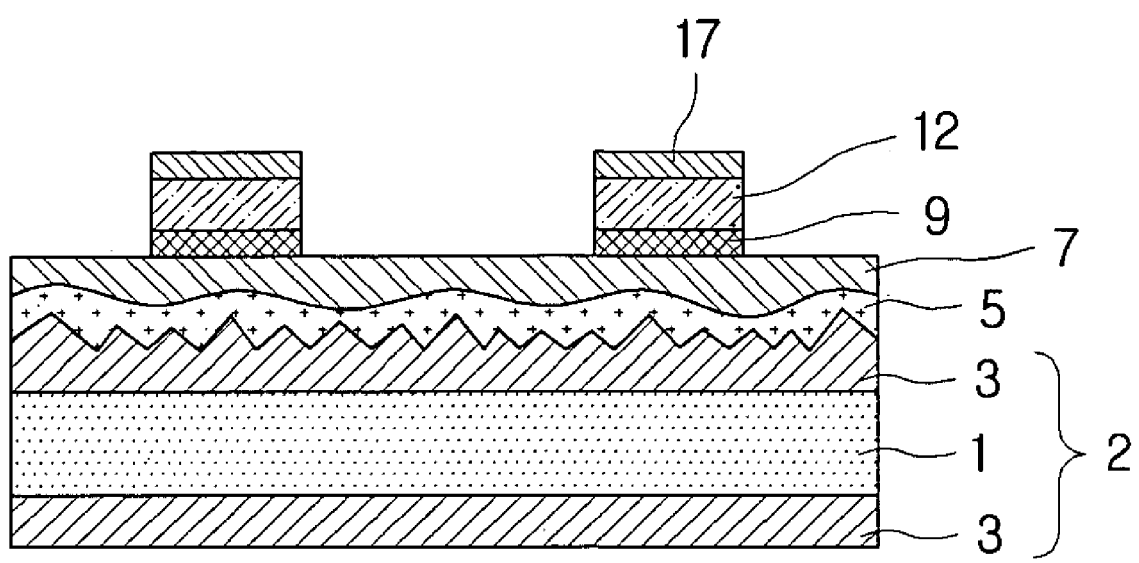

Next, the second plating resist 15 coated with the titanium layer 17 may be removed, so that a circuit pattern 12 may be formed that has the titanium layer 17 coated on the surface (156). As illustrated in FIG. 3J, the titanium layer 17 in areas where the titania nanosheet 19 is not stacked can be removed during the process for stripping the second plating resist 15.

Since the thickness of the titanium layer 17 formed over the second plating resist 15 may be very thin, and unable to withstand the stripping liquid infiltrating from the exterior, the titanium layer 17 outside the areas where the titania nanosheet 19 will be formed may consequently be completely removed.

Figure 3K:
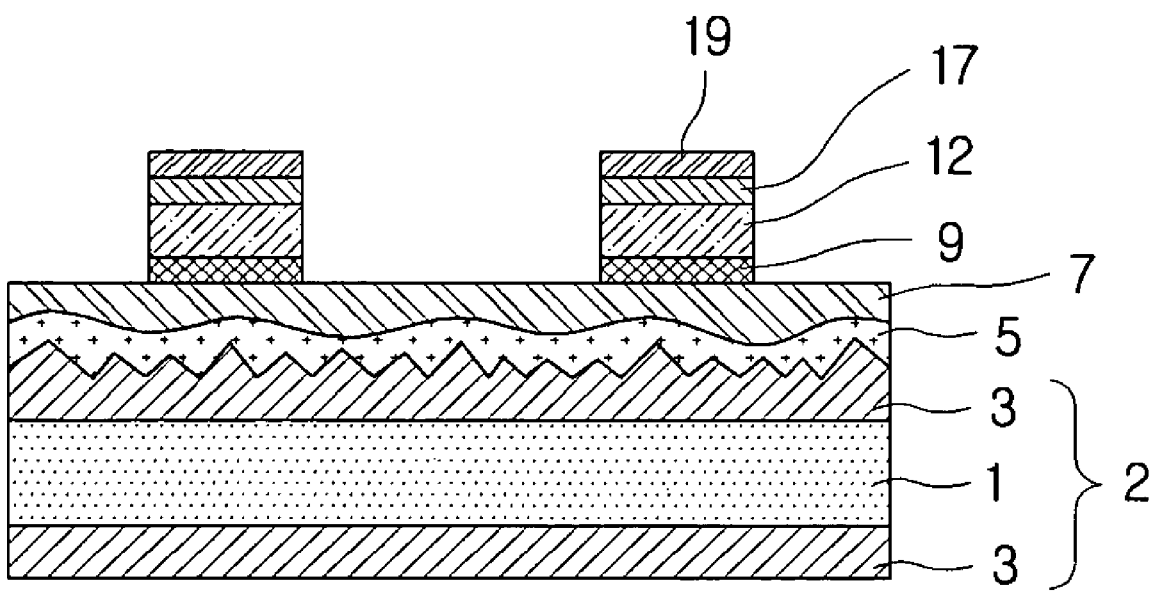

Finally, the titania nanosheet 19 may be attached, in correspondence with the circuit pattern 12 coated with the titanium layer 17 (158). By stacking the titania nanosheet 19 over the patterned circuit pattern 12, as illustrated in FIG. 3K, a nanosheet dielectric film may be formed in a stable manner in the desired area, where the nanosheet dielectric film may be implemented in a desired number of layers and thickness.

According to certain embodiments of the invention as set forth above, a polymer layer may be stacked to provide flatness in the board, and a titanium (Ti) layer may be stacked which allows the copper (Cu) of the board to maintain its functionality as an electrode while increasing the adhesion to the titania nanosheet. The titania nanosheet may thus be implemented on a patterned board in a desired shape, number of layers, and thickness.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention. As such, many embodiments other than those set forth above can be found in the appended claims.

What is claimed is:

1. A capacitor comprising:
a board;
a polymer layer formed on one side of the board;
a circuit pattern selectively formed over the polymer layer; and
a titania nanosheet corresponding with the circuit pattern,
wherein the titania nanosheet is made of $TiO_2$, and
the titania nanosheet is a dielectric of the capacitor.

2. The capacitor of claim 1, wherein the board is a copper clad laminate.

3. The capacitor of claim 1, further comprising:
an adhesive layer interposed between the one side of the board and the polymer layer, the adhesive layer configured to attach the polymer layer to the one side of the board.

4. The capacitor of claim 1, further comprising:
a seed layer interposed between the polymer layer and the circuit pattern.

5. The capacitor of claim 4, wherein the seed layer is formed by a sputtering method.

6. The capacitor of claim 1, further comprising:
a titanium (Ti) layer corresponding with the circuit pattern and interposed between the circuit pattern and the titania nanosheet, the titanium layer configured to attach the titania nanosheet to the circuit pattern.

7. The capacitor of claim 6, wherein the titanium layer is formed by a sputtering method.

8. The capacitor of claim 6, wherein the titanium layer has a thickness of 200 to 300 nm.

9. A method of manufacturing a capacitor, the method comprising:
forming a polymer layer over a board;
forming a plating layer over the polymer layer;
forming a circuit pattern by selectively removing the plating layer; and
stacking a titania nanosheet over the circuit pattern, the titania nanosheet corresponding with the circuit pattern,
wherein the titania nanosheet is made of $TiO_2$, and
the titania nanosheet is a dielectric of the capacitor.

10. The method of claim 9, wherein the board is a copper clad laminate.

11. The method of claim 9, wherein the forming of the polymer layer comprises:
attaching the polymer layer to the board by interposing an adhesive layer between the board and the polymer layer.

12. The method of claim 9, further comprising, after the forming of the polymer layer:
applying plasma treatment on a surface of the polymer layer for pretreatment.

13. The method of claim 12, further comprising, after the applying of the plasma treatment:
stacking a seed layer over the polymer layer.

14. The method of claim 13, wherein the stacking of the seed layer is performed by a sputtering method.

15. The method of claim 9, wherein the forming of the circuit pattern comprises:
stacking a first plating resist over the plating layer and selectively removing the first plating resist;
etching the exposed plating layer; and
stripping the first plating resist remaining after the removing.

16. The method of claim 15, wherein the stacking of the titania nanosheet comprises:
stacking a second plating resist over portions excluding the circuit pattern;
coating a titanium layer over the circuit pattern and the second plating resist;
removing the second plating resist coated with the titanium layer, such that the circuit pattern is formed with the titanium layer coated on a surface thereof; and
attaching the titania nanosheet to the circuit pattern coated with the titanium layer, such that the titania nanosheet is in correspondence with the circuit pattern.

17. The method of claim 16, wherein the coating of the titanium layer is performed by a sputtering method.

18. A method of manufacturing a capacitor, the method comprising:
   forming a polymer layer over a board;
   forming a plating layer over the polymer layer;
   forming a circuit pattern by selectively removing the plating layer; and
   stacking a titania nanosheet over the circuit pattern, the titania nanosheet corresponding with the circuit pattern,
   wherein the forming of the circuit pattern comprises:
      stacking a first plating resist over the plating layer and selectively removing the first plating resist,
      etching the exposed plating layer, and
      stripping the first plating resist remaining after the removing, and
   wherein the stacking of the titania nanosheet comprises:
      stacking a second plating resist over portions excluding the circuit pattern,
      coating a titanium layer over the circuit pattern and the second plating resist,
      removing the second plating resist coated with the titanium layer, such that the circuit pattern is formed with the titanium layer coated on a surface thereof, and
      attaching the titania nanosheet to the circuit pattern coated with the titanium layer, such that the titania nanosheet is in correspondence with the circuit pattern.

19. The method of claim 18, wherein the coating of the titanium layer is performed by a sputtering method.

* * * * *